United States Patent
Keupp et al.

(10) Patent No.: US 9,547,060 B2
(45) Date of Patent: Jan. 17, 2017

(54) MAGNETIC RESONANCE USING QUAZI-CONTINUOUS RF IRRADIATION

(75) Inventors: Jochen Keupp, Rosengarten (DE); Johan Samuel Van Den Brink, Meteren (NL); Paul Royston Harvey, Best (NL)

(73) Assignee: Koninklijke Philips N.V., Eindhoven (NL)

(*) Notice: Subject to any disclaimer, the term of this patent is extended or adjusted under 35 U.S.C. 154(b) by 714 days.

(21) Appl. No.: 14/002,549

(22) PCT Filed: Feb. 28, 2012

(86) PCT No.: PCT/IB2012/050929
§ 371 (c)(1),
(2), (4) Date: Aug. 30, 2013

(87) PCT Pub. No.: WO2012/117350
PCT Pub. Date: Sep. 7, 2012

(65) Prior Publication Data
US 2013/0342207 A1     Dec. 26, 2013

(30) Foreign Application Priority Data
Mar. 3, 2011   (EP) .................................... 11156742

(51) Int. Cl.
*G01R 33/56* (2006.01)
*G01R 33/54* (2006.01)
(Continued)

(52) U.S. Cl.
CPC ............... *G01R 33/54* (2013.01); *G01R 33/32* (2013.01); *G01R 33/3614* (2013.01);
(Continued)

(58) Field of Classification Search
CPC . G01R 33/54; G01R 33/3614; G01R 33/5605; G01R 33/5612; G01R 33/5659; G01R 33/34076; G01G 33/32
See application file for complete search history.

(56) References Cited

U.S. PATENT DOCUMENTS 6,900,636 B2   5/2005   Leussler
6,962,769 B2   11/2005  Shao
(Continued)

FOREIGN PATENT DOCUMENTS

JP   2003000567 A   1/2003

OTHER PUBLICATIONS

Lalith Talagala, S. et al "Whole-Brain 3D Perfusion MRI at 3.0 T Using CASL with a Separate Labeling Coil", Magnetic Resonance in Medicine, vol. 52, 2004, pp. 131-140.
(Continued)

*Primary Examiner* — G. M. Hyder

(57) ABSTRACT

The invention relates to a method of MR imaging of at least a portion of a body (110) of a patient placed in an examination volume of a MR device, the method comprising the steps of:—subjecting the portion of the body (110) to an imaging sequence comprising at least one RF pulse, the RF pulse being transmitted toward the portion of the body (110) via a RF coil arrangement (109) to which RF signals are supplied by two or more RF power amplifiers the RF power amplifiers being activated alternately during the imaging sequence in a time-multiplexed fashion, wherein the imaging sequence requires a RF duty cycle and/or a RF pulse duration exceeding the specification of at least one of the RF power amplifiers;—acquiring MR signals from the portion of the body (110); and—reconstructing a MR image from the acquired MR signals. Moreover, the invention relates to a method of MR spectroscopy involving the alternating use of RF power amplifiers in a time-multiplexed fashion.

25 Claims, 3 Drawing Sheets

(51) Int. Cl.
  *G01R 33/36*   (2006.01)
  *G01R 33/561*  (2006.01)
  *G01R 33/565*  (2006.01)
  *G01R 33/32*   (2006.01)
  *G01R 33/34*   (2006.01)

(52) U.S. Cl.
  CPC ..... *G01R 33/5605* (2013.01); *G01R 33/5612* (2013.01); *G01R 33/5659* (2013.01); *G01R 33/34076* (2013.01)

(56) References Cited

U.S. PATENT DOCUMENTS

| | | | |
|---|---|---|---|
| 6,975,114 | B1 | 12/2005 | Ledden |
| 6,989,673 | B2* | 1/2006 | Zhu .................. G01R 33/5612 324/318 |
| 7,710,117 | B2 | 5/2010 | Vaughan |
| 7,719,281 | B2 | 5/2010 | Fontius |
| 7,728,591 | B2 | 6/2010 | Weizenecker |
| 7,800,368 | B2 | 9/2010 | Vaughan |
| 2003/0214294 | A1* | 11/2003 | Zhu .................. G01R 33/3415 324/309 |
| 2005/0134268 | A1* | 6/2005 | Zhu ..................... G01R 33/288 324/309 |
| 2007/0247152 | A1* | 10/2007 | Klomp ............... G01R 33/4608 324/307 |

OTHER PUBLICATIONS

Esposito, Gennaro et al "Phase Coherence and Solvent Suppression in Rotating-Frame Correlation Experiments in Liquids", Journal of Magnetic Resonance, vol. 80, 1988, pp. 523-527.

Collins, C.M. et al "Strengths and Limitations of Pulsing Coils in an Array Sequentially to Avoid RF Interference in High Field MRI", Proc. Intl. Society Magnetic Resonance in Medicine, vol. 13, 2005, p. 816.

Van Den Bergh, Adrianus et al "Creatine Magnetization Transfer Effect Studied by CW Off Resonance Irradiation in Human Skeletal Muscle", Proc. Intl. Society Magnetic Resonance in Medicine, vol. 9, 2001, p. 1088.

Keupp, J. et al "Parallel RF Transmission based MRI Technique for Highly Sensitive Detection of Amide Proton Transfer in the Human Brain at 3T", Proc. Intl. Society Magnetic Resonance in Medicine, vol. 19, 2011, p. 710.

Wheaton, Andrew J. et al "Method for Reduced SAR T1ρ-Weighted MRI", Magnetic Resonance in Medicine, vol. 51, 2004, pp. 1096-1102.

Zhou, Jinyuan et al "Using the Amide Proton Signals of Intracellular Proteins and Peptides to Detect pH Effects in MRI", Nature Medicine, Technical Reports, vol. 9, No. 8, Aug. 2003, pp. 1085-1090.

Zhou, Jinyuan et al "Practical Data Acquisition Method for Human Brain Tumor Amide Proton Transfer (APT) Imaging", Magnetic Resonance in Medicine, vol. 60, 2008, pp. 842-849.

Zhou, Jinyuan et al "Chemical Exchange Saturation Transfer Imaing and Spectroscopy", Progress in Nuclear Magnetic Resonance Spectroscopy, vol. 48, 2006, pp. 109-136.

Freeman, Ray et al "Decoupling: Theory and Practice I. Current Methods and Recent Concepts", NMR in Biomedicine, vol. 10, 1997, pp. 372-380.

Jones, Craig K. et al "Amide Proton Transfer Imaging of Human Brain Tumors at 3T", Magnetic Resonance in Medicine, vol. 56, 2006, pp. 585-592.

Katscher, Ulrich et al "Parallel RF Transmission in MRI", NMR in Biomedicine, vol. 19, 2006, pp. 393-440.

Keupp, J. et al CEST-Dixon MRI for Sensitive and Accurate Measurement of Amide Proton Transfer in Humans at 3T, Proc. International Society Magnetic Resonance in Medicine, vol. 18, 2010, pp. 338.

Langereis, Sander et al "A Temperature-Sensitive Liposomal H CEST and F Contrast Agent for MR Image-Guided Drug Delivery", Journal American Chemical Society, vol. 131, 2009, pp. 1380-1381.

Pelton, Jeffrey G. et al "Heteronuclear NMR Pulse Sequences Applied to Biomolecules", Annu. Rev. Phys. Chem., vol. 46, 1995, pp. 139-167.

Sepponen, Raimo E. et al "A Method for T1ρ Imaging", Journal of Computer Assisted Tomography, vol. 9, No. 6, 1985, pp. 1007-1011.

Sun, Phillip Zhe et al "An Investigation of Optimizing and Translating pH-Sensitive Pulsed-Chemical Exchange Saturation Transfer (CEST) Imaging to a 3 T Clinical Scanner", Magnetic Resonance in Medicine, vol. 60, No. 4, 008, pp. 834-841.

Sun, Phillip Zhe et al "Relaxation-Compensated Fast Multislice mide Proton Transfer (APT) Imaging of Acute Ischemic Stroke", Magnetic Resonance in Medicine, vol. 59, 2008, pp. 1175-1182.

Sun, Phillip Zhe et al "Imaging pH using the Chemical Exchange Saturation Transfer (CEST) MRI: Correction of Concomitant RF Irradiation Effects to Quantity Cest MRI for Chemical Exchange Rate and pH", Magnetic Resonance in Medicine, vol. 60, 2008, pp. 390-397.

* cited by examiner

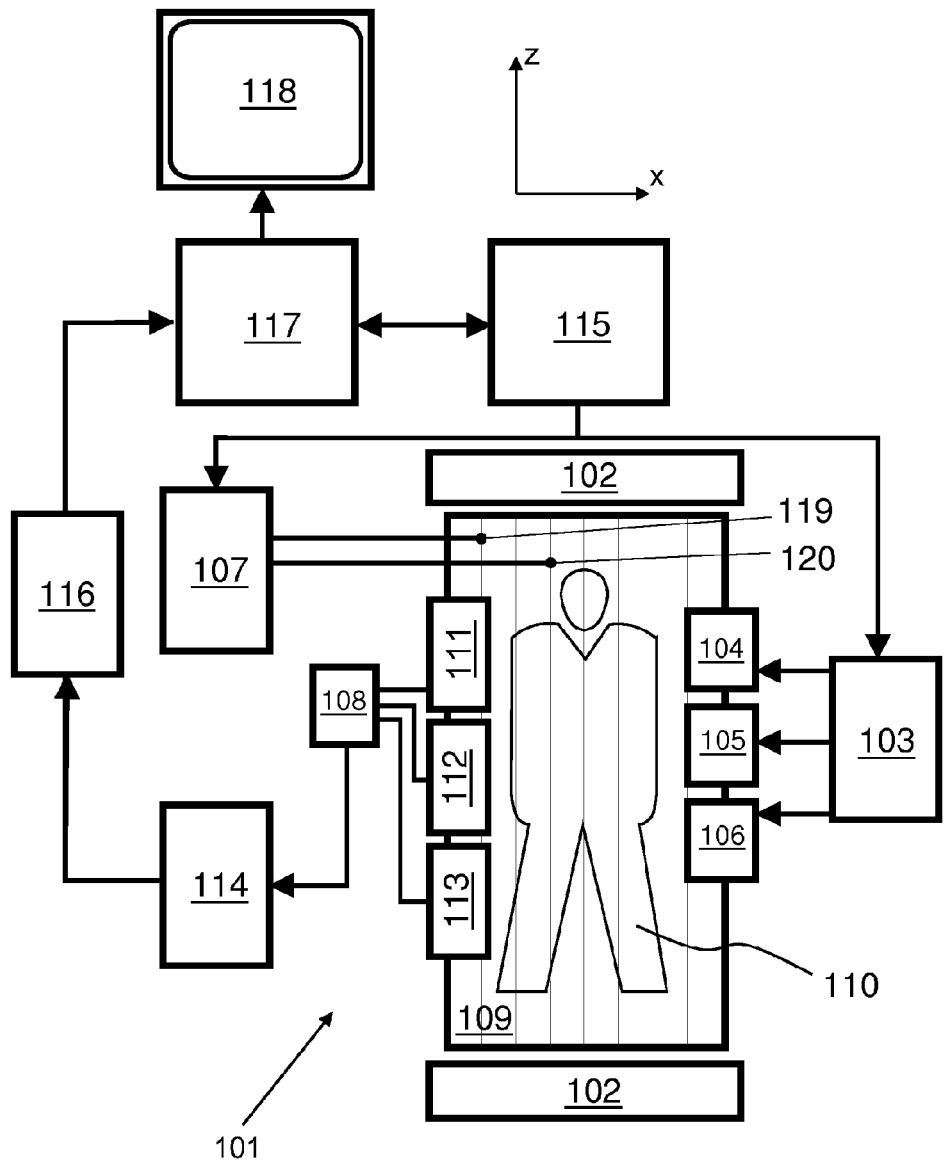
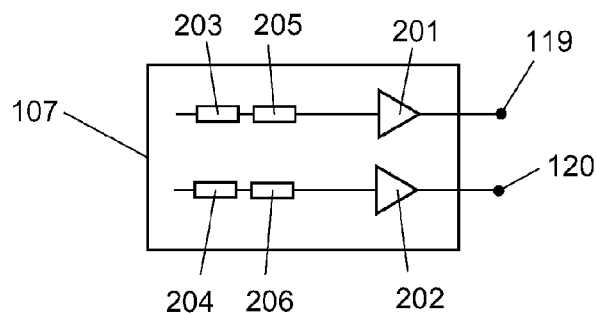
Fig. 1
Fig. 2

MAGNETIC RESONANCE USING QUAZI-CONTINUOUS RF IRRADIATION

CROSS-REFERENCE TO PRIOR APPLICATIONS

This application is the U.S. National Phase application under 35 U.S.C. §371 of International Application No. PCT/IB2012/050929, filed on Feb. 28, 2012, which claims the benefit of European Patent Application No.11156742.6, filed on Mar. 3, 2011 . These applications are hereby incorporated by reference herein.

TECHNICAL FIELD

The invention relates to the field of magnetic resonance (MR) imaging. It concerns a method of MR imaging and a method of MR spectroscopy. The invention also relates to a MR device and to a computer program for a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field of the RF pulse extends perpendicular to the z-axis, so that the magnetization performs a precession about the z-axis. This motion of the magnetization describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°). The RF pulse is radiated toward the body of the patient via a RF coil arrangement of the MR device. The RF coil arrangement typically surrounds the examination volume in which the body of the patient is placed.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within the examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

In some medical applications, the difference in MR signal intensity from standard MR protocols, i.e. the contrast, between different tissues might not be sufficient to obtain satisfactory clinical information. In this case, contrast enhancing techniques are applied, which rely for example on advanced MR sequences or on MR contrast agents, like paramagnetic agents (Gd-DTPA/DOTA), or combinations of both. In a number of important MR applications with or without using contrast agents, advanced contrast enhancing MR sequences are favorable, which employ long RF pulses or quasi continuous-wave RF transmission for e.g. saturation transfer, hetero- or homonuclear polarization transfer, proton decoupling or spin locking.

A particularly promising approach for contrast enhancement and increase of MR detection sensitivity (by orders of magnitude) is the known method based on 'Chemical Exchange Saturation Transfer' (CEST), as initially described by Balaban et al. (see e.g. U.S. Pat. No. 6,962,769 B1). With this CEST technique, the image contrast is obtained by altering the intensity of the water proton signal in the presence of a contrast agent with a fast-relaxing proton pool resonating at a slightly different frequency than the main water resonance. This is achieved by selectively saturating the nuclear magnetization of the pool of exchangeable protons which resonate at a frequency different from the water proton resonance. Exchangeable protons can be provided by exogenous CEST contrast agents (e.g. DIACEST, PARACEST or LIPOCEST agents), but can also be found in biological tissue (e.g. endogenous amide protons in proteins and peptides or protons in glucose, not covered in the original Balaban method). A frequency-selective saturation RF pulse that is matched to the MR frequency of the exchangeable protons is used for this purpose. The saturation of the MR signal of the exchangeable protons is subsequently transferred to the MR signal of nearby water protons within the body of the examined patient by (chemical or physical) exchange with the water protons, thereby decreasing the water proton MR signal. The selective saturation at the MR frequency of the exchangeable protons thus gives rise to a negative contrast in a proton-density weighted MR image. Amide proton transfer (APT) MR imaging of endogenous exchangeable protons allows highly sensitive and specific detection of pathological processes on a molecular level, like increased protein concentrations in malignant tumor tissue. The APT signal is also sensitively reporting on locally altered pH levels—because the exchange rate is pH dependent—which can be e.g. used to characterize ischemic stroke. CEST contrast agents have several important advantages over $T_1$- and $T_2$-based MR contrast agents. CEST contrast agents allow for multiplexing by using a single compound or a mixture of compounds bearing exchangeable protons that can be addressed separately in a multi-frequency CEST MR examination. This is of particular interest for molecular imaging, where multiple biomarkers may be associated with several unique CEST frequencies. Moreover, the MR contrast in APT/CEST MR imaging can be turned on and off at will by means of the selective saturation RF pulse. Adjustable contrast enhancement is highly advantageous in many applications, for example when the selective uptake of the contrast agent in the diseased tissue in examined body is slow.

A problem of all known APT/CEST MR imaging techniques is that the selective saturation prior to the actual acquisition of image data takes a comparably long time. The build-up of the saturation of the exchangeable protons is a relatively slow process (the characteristic timescale is on the order of one second). Consequently, the desirable saturation period for APT/CEST measurements is typically 2-5 seconds. Then, immediately following the saturation period, a (slice-selective) excitation RF pulse is usually applied for generation of the bulk water MR signal and one or more MR signals are recorded, for example as gradient echoes or spin echoes. The acquisition of individual MR signals used for imaging takes typically only several milliseconds up to a few hundred milliseconds, wherein the full k-space is acquired as a set of these short signal acquisitions.

Since the APT/CEST technique is based on narrow-band off-resonance RF saturation of the exchangeable proton pool, significant average RF power, ideally a continuous-wave RF irradiation or RF pulse trains with high duty cycle, are required during several seconds prior to the actual MR signal acquisition. When implemented on MR imaging systems which are in clinical use at present, the APT/CEST detection sensitivity is disadvantageously suboptimal due to the hardware constraints of the standard RF power amplifiers commonly used in those systems. Such standard RF power amplifiers are designed to deliver high-power short RF pulses for imaging applications, wherein the maximum length of the RF pulses as well as the RF duty cycle are limited because of the heat dissipation within the electronics of the RF power amplifier. A typical solid-state RF power amplifier of MR imaging devices allows up to 250 ms of RF pulse duration with a RF duty cycle of 50%. This is not suitable for effective APT/CEST MR imaging which actually requires continuous-wave RF irradiation or pulse trains with a RF duty cycle of 70 to 100% over a time interval of 2-5 seconds for obtaining sufficient saturation of the proton magnetization, albeit at a lower RF power than required for the short RF pulses used for MR image-acquisition. Presently, saturation sequences are applied on clinical MR imaging systems with short RF saturation pulses of up to 800 ms only, as a result of the mentioned hardware constraints. This disadvantageously leads to a substantially reduced APT/CEST signal as compared to the CEST signal that could be obtained with optimal saturation.

A further disadvantage of the saturation sequences conventionally applied in APT/CEST MR imaging is that the ability to quantify the CEST effect may be compromised due to a spatially inhomogeneous saturation effect of the saturation RF pulse. A reason could be an imperfect homogeneity of the spatial distribution of the RF magnetic field ($B_1$) during saturation. This is particularly a problem at high static magnetic field strength of 3 Tesla or more. The inhomogeneity of the $B_1$-field results in non-linear distortions of the CEST signal intensity. A quantitative analysis of the CEST effect, which would be desirable for various applications, is difficult to achieve under such conditions.

Finally, it has to be mentioned that APT/CEST MR imaging is particularly constrained by the safety regulations for heat deposition (SAR) in the tissue of the examined patient because the long and powerful RF irradiation during saturation results in a considerable SAR contribution.

SUMMARY OF THE INVENTION

From the foregoing it is readily appreciated that there is a need for an improved MR technique. It is consequently an object of the invention to provide a MR method and a MR device which are able to alleviate the above-described constraints for long (i.e. quasi continuous-wave) RF transmission and to enable the generation of long RF pulses with improved homogeneity of the RF $B_1$-field while maintaining or minimizing the SAR contribution.

In accordance with the invention, a method of MR imaging of at least a portion of a body is disclosed. The method comprises the steps of:

subjecting the portion of the body to an imaging sequence comprising at least one RF pulse, the RF pulse being transmitted towards the portion of the body via a RF coil arrangement to which RF signals are supplied by two or more RF power amplifiers, the RF power amplifiers being activated alternately during the imaging sequence in a time-multiplexed fashion, wherein the imaging sequence requires a RF duty cycle and/or a RF pulse duration exceeding the specification of at least one of the RF power amplifiers;
  acquiring MR signals from the portion of the body; and
  reconstructing a MR image from the acquired MR signals.

Moreover, a method of MR spectroscopy of an object is disclosed, the method comprises the steps of:

subjecting the object to a spectroscopy sequence comprising at least one RF pulse, the RF pulse being transmitted toward the object via a RF coil arrangement to which RF signals are supplied by two or more RF power amplifiers, the RF power amplifiers being activated alternately during the spectroscopy sequence in a time-multiplexed fashion, wherein the spectroscopy sequence requires a RF duty cycle and/or a RF pulse duration exceeding the specification of at least one of the RF power amplifiers;
  acquiring MR signals from the object; and
  deriving a MR spectrum from the acquired MR signals.

The basic idea of the invention is to apply multiple independent RF amplifiers in a time-multiplexed fashion to generate quasi continuous-wave RF transmission at substantially one and the same frequency (apart from a small frequency shift for narrow-band off-resonance RF saturation e.g. according to the APT/CEST technique) throughout the RF pulse duration or even throughout the complete sequence. Two or more RF power amplifiers are used to drive the RF coil arrangement. The alternate transmission of RF signals over the different RF power amplifiers is used to create long RF pulses which require a RF duty cycle and/or pulse duration exceeding the specification of a single RF power amplifier, i.e. RF pulses having a duration of, for example, more than 250 ms and/or requiring a RF duty-cycle of more than 50%. Actually, the duration of the RF pulse can be substantially longer than the maximum allowed pulse length of an individual RF power amplifier and no waiting time has to be introduced into the (imaging or spectroscopy) sequence after the long RF pulse in order to stay within the RF duty cycle limits. A quasi continuous-wave saturation RF field with arbitrary length of for example one second, or even two or more seconds can be generated, while each individual RF power amplifier stays within its duty cycle limit. Each individual RF power amplifier is operated within the short RF pulse regime by assuring that each RF power amplifier is activated during a time interval of less than the maximal allowed activation period. This can be achieved, for example, by subdividing the RF pulse into sets of RF pulse segments, wherein each set of RF pulse segments is generated by a different RF power amplifier or by a different set of RF power amplifiers. In this case, the concatenated RF pulse segments constitute one long RF pulse.

The approach of the invention can advantageously be used to produce different types of long or quasi continuous-wave RF pulses. The long RF pulse of the method of the invention may be, for example, a saturation RF pulse for saturating nuclear magnetization, or a spin locking RF pulse for e.g. measuring the longitudinal relaxation time in the so-called rotating frame ($T_1\rho$), or a homonuclear or heteronuclear polarization transfer RF pulse for transferring magnetization between different nuclear spins for nuclear Overhauser enhanced (NOE) MR spectroscopy and imaging, or a proton decoupling RF pulse in multi-nuclear MR spectroscopy and imaging. In particular, the at least one long RF pulse of the method of the invention can be a frequency-selective saturation RF pulse for saturating nuclear magnetization of protons of an exchangeable pool, belonging to endogenous molecules or to a CEST contrast agent.

It is generally desirable to have a good spatial homogeneity of the generated $B_1$-field for excitation or saturation of magnetic resonance throughout the examined object. However, as the MR frequency increases with increasing main magnetic field strength, this becomes more difficult due to conductive losses and wavelength effects within the object. MR imaging with multi-channel parallel RF transmission has been accepted as a standard method of operating RF coils to achieve an enhanced homogeneity of the $B_1$-field. Compared with a single channel transmission mode of operation, already a two-channel parallel transmission technique results in a significantly increased $B_1$ homogeneity.

In known parallel RF transmission systems the RF signal is typically supplied to the RF coil arrangement via RF drive ports being connected to individual coil elements of the RF coil arrangement, either directly or via a so called butler-matrix to drive specific electromagnetic modes of the RF field. The RF coil arrangement may be a so-called birdcage resonator comprising a plurality of coil elements (e.g. rungs or rods) arranged in parallel to a longitudinal axis of the main magnetic field, wherein the birdcage resonator surrounds the imaged object. In this case, the RF drive ports are connected to two or more rods of the birdcage resonator. Two-channel parallel transmission MR systems typically use two independent RF transmit chains and amplifiers for applying the RF signals to the RF drive ports of the RF coil arrangement. The RF signals applied to the different RF drive ports can be controlled individually with respect to amplitude and phase in order to optimize the homogeneity of the $B_1$-field (so-called RF shimming).

According to a preferred embodiment of the invention, the RF coil arrangement comprises two or more coil elements, each coil element being assigned to a group of coil elements, wherein each group of coil elements is associated with at least one RF power amplifier supplying RF signals to the coil elements of the respective group of coil elements.

The time-multiplexed alternating activation of the RF power amplifiers according to the invention can advantageously be applied in multi-channel parallel transmission systems as described above. The RF power amplifiers assigned to the different transmit channels are activated alternately in order to generate the long or quasi continuous-wave RF pulse. In systems with a larger number of transmission channels, groups of channels can be used for the time-multiplexing according to the invention. Within the individual groups, the $B_1$ homogeneity as well as the RF heating can be optimized by using appropriate settings for amplitude and phase in each channel.

The RF power amplifiers associated with different groups of coil elements can be activated during non-overlapping or partly overlapping time slots according to the invention. The amplitudes and/or the phases of the RF signals supplied to the RF coil arrangement via the individual RF power amplifiers can be controlled in such a manner that the instantaneous and/or the time-integrated homogeneity of the RF magnetic field distribution of the at least one long RF pulse is optimized. In the case of a non-overlapping activation of the different RF power amplifiers, the incoherent sum (i.e. the modulus) of the RF signals generated during the different activation periods provides sufficient homogeneity of the RF magnetic field distribution of the long or quasi continuous-wave RF pulse. In the case of a partly overlapping activation of the individual RF power amplifiers, the coherent superposition of the RF signals generated via the different channels has to be considered. This enables the application of RF shimming as in conventional multi-channel parallel transmission systems The invention does not only relate to a MR method but also to a MR device. According to the invention the MR device includes:
  a main magnet for generating a uniform, steady magnetic field within an examination volume,
  at least one RF coil arrangement for generating RF pulses within the examination volume and/or for receiving MR signals from an object positioned in the examination volume,
  a transmission unit, which includes two or more RF power amplifiers supplying RF signals to the RF coil arrangement,
  a control unit controlling the temporal succession of RF pulses, which control unit is adapted to activate the RF power amplifiers alternately in a time-multiplexed fashion, thereby generating a sequence of RF pulses requiring a RF duty cycle and/or a RF pulse duration exceeding the specification of at least one of the RF power amplifiers.

According to a preferred embodiment, all RF power amplifiers of the MR device are high-power/low-duty-cycle amplifiers. This means that according to the specifications of each individual RF power amplifier, the RF duty cycle is limited to a maximum of e.g. 50%. The maximum pulse duration is limited to e.g. 250 ms. On the other hand, the high-power/low-duty-cycle RF power amplifiers are able to deliver RF pulses having a RF peak power of several kW or even more than 10 kW as required for most MR imaging sequences. The time-multiplexed activation of the high-power/low-duty-cycle RF power amplifiers enables the generation of long or quasi continuous-wave RF pulses which are beyond the specification of a single high-power/low-duty-cycle RF power amplifier. In this embodiment, no low-power/high-duty-cycle mode of the RF power amplifiers needs to be provided, leading to cost reduction in the RF transmit chain.

Alternatively, at least one RF power amplifier may be a high-power/low-duty-cycle amplifier while at least one other RF power amplifier is a low-power/high-duty-cycle amplifier. In this embodiment of the invention the low-power/high-duty-cycle amplifier is less limited with regard to RF duty cycle and pulse duration. The specified RF duty-cycle of the RF power amplifier may be 70-100%, while the maximum allowable RF pulse duration may be 1 s or more. However, the RF peak power is limited to, for example, a maximum of 1 kW or less. The low-power/high-duty-cycle RF power amplifier and the high-power/low-duty-cycle RF power amplifier are used alternately, wherein the low-power/high-duty-cycle RF power amplifier is used for the generation of long or continuous-wave RF pulses (for magnetization preparation, saturation, spin-locking, etc.), while the high-power/low-duty-cycle RF power amplifier is used for acquisition of MR signals for imaging or spectroscopy (i.e. for exciting resonance, inverting magnetization, refocusing resonance, or manipulating resonance or magnetization in any other desired manner).

The transmission unit (107) has two or more transmit channels, each RF power amplifier (201, 202, 701) being associated with one transmit channel.

The method of the invention can be advantageously carried out with the quickly growing number of MR devices in clinical use, which feature parallel RF transmission with more than one RF amplifier. To this end, it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

FIG. 1 shows a MR device according to the invention;

FIG. 2 shows the multi-channel parallel RF transmission unit of the MR device of FIG. 1 in more detail;

DETAILED DESCRIPTION OF THE EMBODIMENTS

Figure 3:
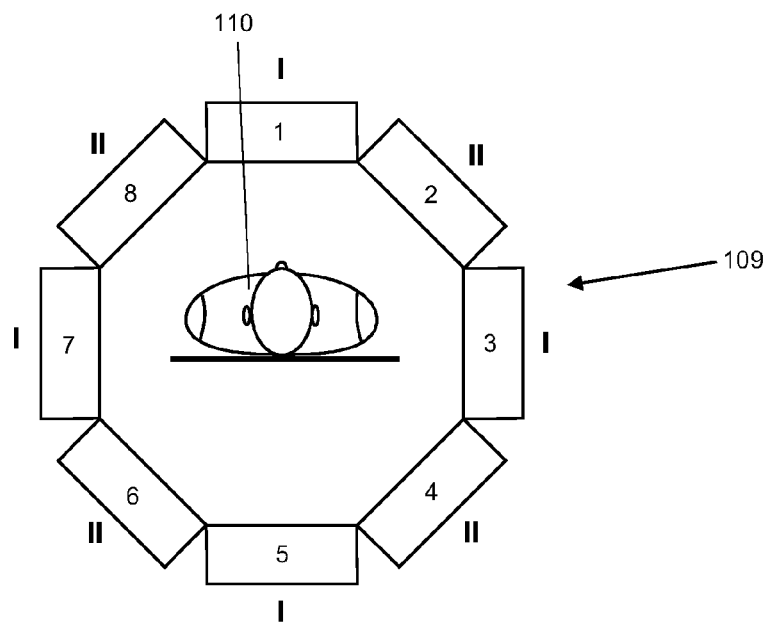
FIG. 3 shows a cross section of a RF coil arrangement with groups of RF coil elements.

With reference to FIG. 1, a MR device 101 is shown. The device comprises superconducting or resistive main magnet coils 102 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 103 applies current pulses to selected ones of whole-body gradient coils 104, 105 and 106 along x, y and z-axes of the examination volume. A multi-channel transmission unit 107 transmits RF pulses or pulse packets via two RF drive ports 119, 120 to a whole-body volume RF coil 109 to transmit RF pulses into the examination volume.

A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or otherwise manipulate resonance or magnetization and select a portion of a body 110 positioned in the examination volume. The MR signals are also picked up by the whole-body volume RF coil 109.

For generation of MR images of limited regions of the body 110 by means of parallel imaging, a set of local array RF coils 111, 112, 113 are placed contiguous to the region selected for imaging. The array coils 111, 112, 113 can be used to receive MR signals induced by body-coil RF transmissions.

The resultant MR signals are picked up in the depicted embodiment by the array RF coils 111, 112, 113 and demodulated by a receiver 114 preferably including a preamplifier (not shown). The receiver 114 is connected to the RF coils 111, 112 and 113 via switch 108.

A host computer 115 controls the gradient pulse amplifier 103 and the transmitter 107 to generate any of a plurality of MR imaging sequences, such as echo planar imaging (EPI), echo volume imaging, gradient and spin echo imaging, fast spin echo imaging, and the like. For the selected sequence, the receiver 114 receives a single or a plurality of MR data lines in rapid succession following each RF excitation pulse. A data acquisition system 116 performs analog-to-digital conversion of the received signals and converts each MR data line to a digital format suitable for further processing. In modern MR devices the data acquisition system 116 is a separate computer which is specialized in acquisition of raw image data.

Ultimately, the digital raw image data is reconstructed into an image representation by a reconstruction processor 117 which applies a Fourier transform and other appropriate reconstruction algorithms, such like SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 118 which provides a man-readable display of the resultant MR image.

FIG. 2 schematically shows the two-channel RF transmission unit 107 of the MR device 101. The transmission unit 107 is used for supplying RF signals to the RF coil arrangement 109. To this end, the output ports of the transmission unit 107 are connected to the RF drive ports 119 and 120 of the RF coil arrangement 109. The transmission unit 107 comprises two transmit channels, wherein each transmit channel includes a RF power amplifier 201, 202. The RF power amplifiers 201, 202 work in the high-power mode, which means that they are able to deliver RF pulses with a duration of up to $T_{pmax}$ (e.g. 250 ms), wherein the RF duty cycle of the RF power amplifiers 201, 202 is limited to e.g. 50%. According to the invention, the RF power amplifiers 201, 202 are activated alternately during the generation of a long RF pulse having a duration of more than $T_{pmax}$. In this way a quasi continuous-wave RF transmission can be achieved, wherein each RF power amplifier 201, 202 stays within its duty cycle (<50%) and short pulse limit (<$T_{pmax}$). Each transmit channel of the transmission unit 107 comprises a controllable attenuator 203, 204 and a phase shifter 205, 206 for the purpose of controlling the amplitudes and phases of the RF signals provided to the RF coil arrangement 109 via the individual transmit channels.

FIG. 3 shows a cross section of a RF coil arrangement 109, comprising a plurality of individual coil elements 1 to 8 (for example RF antenna elements in the form of planar strips mounted to the inner wall of the bore of the main magnet 102) arranged around the circumference of the examination volume. The body 110 of the patient is positioned within the RF coil arrangement 109 close to its centre. The RF coil arrangement 109 is connected to a multichannel transmission unit (not shown in FIG. 3) having eight transmit channels, each transmit channel being associated with one of the coil elements 1 to 8. According to the invention, the coil elements 1 to 8 are assigned to one of two groups I, II of coil elements. Group I is associated with the RF power amplifiers supplying RF signals to the coil elements 1, 3, 5, and 7, while group II is associated with the RF power amplifiers supplying RF signals to the coil elements 2, 4, 6, and 8.

Figure 4:
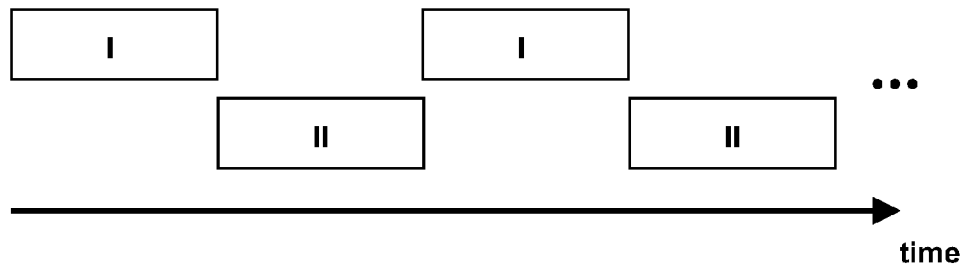
FIG. 4 shows a timing diagram illustrating the time-multiplexed activation of RF power amplifiers according to the invention.

FIG. 4 illustrates the time-multiplexed activation of the RF amplifiers according to the invention. The RF power amplifiers of group I and group II are alternately activated during non-overlapping time slots. Within each group I, II the duty cycle and maximum pulse length limits of the individual RF amplifiers associated with the respective group are maintained. Time-multiplexing between the groups I and II is applied by activating the groups I, II at different time points during the required long RF irradiation. In this way the invention enables to achieve a situation close to continuous-wave RF irradiation, which can be termed quasi continuous-wave RF irradiation. The RF power amplifiers associated with the groups I, II are under control of the system software for unblanking/gating of the RF power amplifiers and to ensure operation within the respective duty cycle and pulse duration limits. That is the at least one RF pulse is generated by alternately activating the RF power amplifiers (109) associated with the different groups (I, II) of coil elements (1-16). The system software also controls and monitors the RF energy deposition within the body 110 (SAR) not to exceed safety limits. The incoherent sum (i.e. the modulus) of the RF signals irradiated via groups I and II will provide sufficient homogeneity of the RF magnetic field distribution of the time-multiplexed long RF pulse. Conventional RF shimming based on parallel RF transmission within the individual groups I, II is of course also possible.

Figure 5:
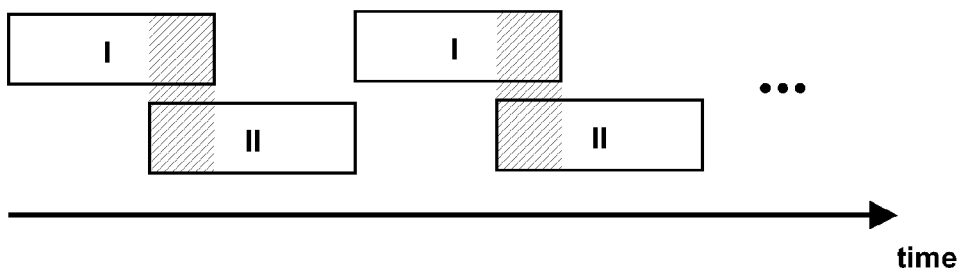
FIG. 5 shows a timing diagram of a second embodiment of the invention.

An alternative timing diagram of the time-multiplexed activation is shown in FIG. 5. The scheme shown in FIG. 5 can be used to obtain improved homogeneity of the RF magnetic field distribution during the generated long RF pulse. The groups I and II of coil elements are activated during partly overlapping time slots. The time intervals during which the activation of the respective RF power amplifiers are overlapping are indicated by the hatchings in FIG. 5. During the overlapping time slots RF shimming across the groups I and II is possible in addition to RF shimming within the groups I, II. Because of the overlapping activation of the RF power amplifiers the amplitudes and phases of the RF signals can be controlled in such a manner that the coherent sum of the irradiated RF fields results in an overall RF magnetic field distribution with good homogeneity. This is of particular importance for a quantitative analysis of an acquired CEST image in the respective region of interest. Furthermore, it can be applied for reproducible contrast generation in other applications using long RF pulses.

The minimum condition for homogeneity of the RF magnetic field distribution of the time-multiplexed quasi continuous-wave RF pulse is that the time-integrated incoherent sum (i.e. the modulus) of the excitation and/or saturation effects of all RF pulse subsets is sufficiently homogeneous. In general, quickly interleaving of multiple inhomogeneous saturation patterns from the individual groups I, II will lead to a homogeneous overall saturation, provided that the time-integrated saturation effect is uniform. This type of achieving a homogeneous saturation and/or excitation is different from conventional RF shimming because the phases of the RF signals irradiated during the different time slots cannot be used to optimize the homogeneity. If there is more than one RF power amplifier operating simultaneously during the quasi continuous-wave irradiation according to the invention, amplitudes and phases can be controlled for optimized homogeneity of the RF magnetic field and for minimal RF heating by the system software. This is applicable in cases in which more than one coil element and RF power amplifier is associated with each group of coil elements as it is the case in the embodiment depicted in FIG. 3. RF shimming can be applied across the groups provided that the different groups are activated in the time-multiplexing scheme during overlapping time slots as depicted in FIG. 5. Shimming across the groups brings the advantage of increased degrees of freedom for the RF shimming process which leads to improved RF field homogeneity. Even if there are time intervals during the quasi continuous-wave RF pulse generation, during which RF shimming cannot be optimally applied, the spatial homogeneity of the overall net saturation and/or excitation effect can still be optimized. This can be accomplished by actively adjusting the RF magnetic field distribution during the different time intervals, such that the overall time-integral, i.e. the net effect of the RF irradiation, is homogeneously distributed within the examined object. In addition, as already mentioned, the degrees of freedom for RF shimming can be used to minimize the time-integrated RF electric components throughout the examined object in order to reduce heating (SAR). This addresses a common shortcoming of conventional MR imaging sequences with long and powerful RF irradiation, which are limited by the safety regulations with respect to maximum SAR (specific absorption rate).

Figure 6:
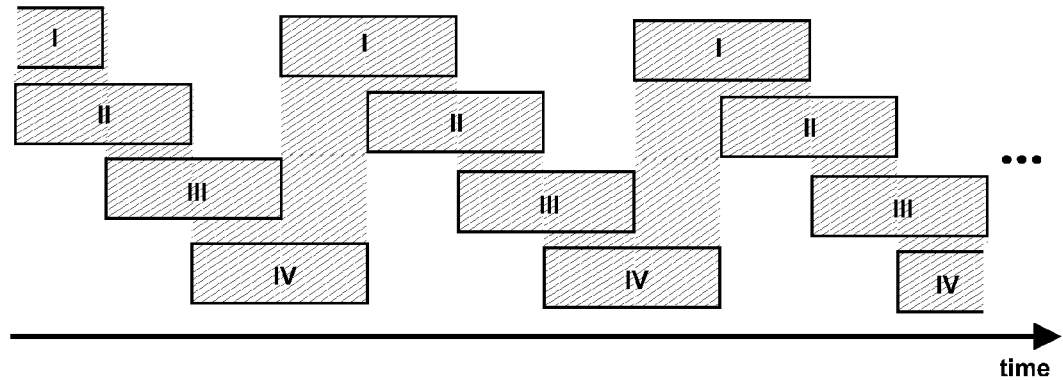
FIG. 6 shows a timing diagram of a third embodiment of the invention.

A further embodiment is depicted in FIG. 6. FIG. 6 illustrates a time-multiplexing scheme in which four groups I to IV of coil elements are alternately activated via the the respective RF power amplifiers. The hatched time intervals in FIG. 6 indicate that coherent RF shimming across the groups I to IV is possible at each time point of the long RF pulse.

Figure 7:
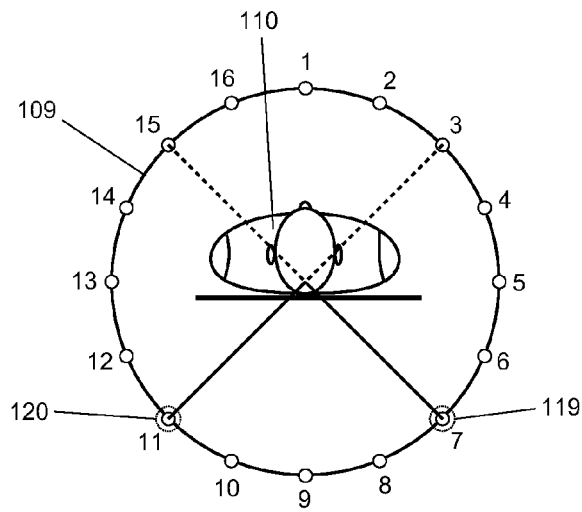
FIG. 7 shows a cross section of a RF coil arrangement and a transmission
Figure 7:
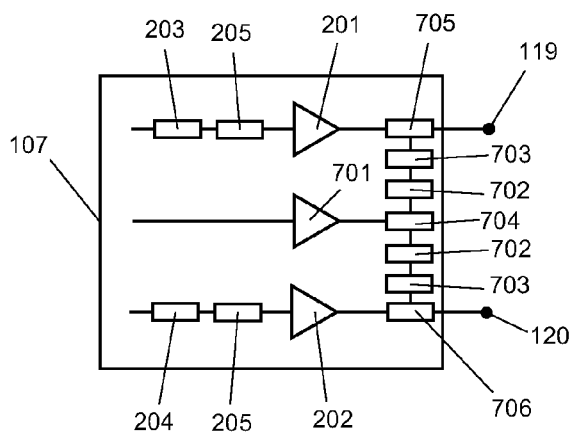

Yet another embodiment of the invention is shown in FIG. 7. FIG. 7 describes RF transmission based on time-multiplexed operation of two RF power amplifiers of different types or in different operational modes (low-power mode/high-power mode), which are jointly connected to a drive port of the RF coil arrangement. FIG. 7 shows a cross section of a birdcage resonator as RF coil arrangement 109 comprising a plurality of rods 1 to 16 arranged in parallel to the main field axis z. The birdcage resonator surrounds the examination volume of the MR device 101. The body 110 of the patient is positioned within the birdcage resonator close to its centre. The RF drive ports 119 and 120 are connected to rods 7 and 11 of the birdcage resonator. Two linear modes of the birdcage resonator 109 are used for RF transmission and for the application of RF shimming. The transmission unit 107 used in this embodiment comprises RF power amplifiers 201, 202 as well as attenuators 203, 204 and phase shifters 205, 206 as in the embodiment illustrated in FIGS. 1 and 2. The RF power amplifiers 201, 202 are high-power/low-duty-cycle amplifiers. The RF power amplifiers 201, 202 are used to excite resonance, invert magnetization, refocus resonance, or manipulate resonance in a desired manner during a MR imaging sequence. Additionally, provision is made for a low-power/high-duty-cycle RF power amplifier 701. RF power amplifier 701 is used for generating a long or (quasi) continuous-wave RF pulse in accordance with the invention. RF power amplifiers 201, 202 and 701 are activated alternately. Attenuators 702 and phase shifters 703 enable amplitude and phase control of the long RF pulse for the purpose of RF shimming during the long RF pulse. A power splitter 704 and power combiners 705, 706 are provided for supplying the RF signal from the RF power amplifier 701 to the drive ports 119, 120 of the birdcage resonator 109. For example in a CEST imaging session, the quasi continuous-wave saturation RF pulse is generated by means of RF power amplifier 701, while the high-power short RF pulses required for acquisition of MR imaging signals after CEST saturation are generated by means of the RF power amplifiers 201, 202. The control and alternated activation of the high-power channels and the low-power.

The application of separate RF power amplifiers for the generation of a long

RF pulse extends the scope of the invention also to systems comprising only a single RF coil element, like the single-channel quadrature body coil in standard clinical MR scanners.

Furthermore, a low-cost version can be realized by adding low-power/high-duty-cycle RF power amplifiers to groups of coil elements in a joint fashion, for example by means of appropriate power splitting of the RF signals at the output of the RF power amplifiers and feeding of the RF signals into the individual coil elements, like exemplified in the embodiment shown in FIG. 7. Phase and amplitude adjustment of the split RF signals for RF shimming remains possible via attenuators (702) and phase shifters (703). Generally, a plurality of RF power amplifiers that are activated alternately may be used according to the invention, wherein the output signals of the RF amplifiers are routed to corresponding coil elements of the RF coil arrangement. Alternatively, the output power of the RF power amplifiers may be distributed over a set of channels in a multi-channel transmit system, for example via a so-called butler-matrix to drive specific modes of the RF field.

The invention claimed is:

1. A method of magnetic resonance (MR) imaging of at least a portion of a body, the method comprising:
   subjecting the portion of the body to an imaging sequence comprising at least one radiofrequency (RF) pulse, the RF pulse being transmitted toward the portion of the body via an RF coil arrangement to which RF signals are supplied by two or more RF power amplifiers, the RF power amplifiers being activated alternately during the imaging sequence in a time-multiplexed fashion, wherein the RF power amplifiers associated with different groups of coil elements are activated during non-overlapping or partly overlapping time slots and in the case of a non-overlapping activation of the different RF power amplifiers, an incoherent sum of the RF signals is generated during the different activation periods and in the case of a partly overlapping activation of the individual RF power amplifiers, a coherent superposition of the RF signals is generated and wherein the imaging sequence requires an RF duty cycle and/or an RF pulse duration exceeding a specification of at least one of the RF power amplifiers;
   acquiring MR signals from the portion of the body; and
   reconstructing an MR image from the acquired MR signals.

2. The method of claim 1, wherein the at least one RF pulse is generated by alternately activating the RF power amplifiers, wherein the at least one RF pulse is subdivided into sets of RF pulse segments, each set of RF pulse segments being generated by a different RF power amplifier or set of RF power amplifiers.

3. The method of claim 2, wherein the frequency of the RF pulse is substantially the same for all RF pulse segments.

4. The method of claim 1, wherein the at least one RF pulse is
   a saturation RF pulse for saturating nuclear magnetization, or
   a spin locking RF pulse, or
   a polarization transfer RF pulse for transferring magnetization between different nuclear spins, or
   a proton decoupling RF pulse.

5. The, method of claim 4, wherein the at least one RF pulse is a frequency-selective saturation RF pulse for saturating nuclear magnetization of protons of an exchangeable endogenous proton pool or of a CEST contrast agent.

6. The method of claim 1, wherein the RF coil arrangement comprises two or more coil elements each coil element being assigned to a group of coil elements, wherein each group of coil elements is associated with at least one RF power amplifier supplying RF signals to the coil elements of the respective group of coil elements.

7. A magnetic resonance (MR) device configured to perform the method of claim 1, the MR device comprising:
   a main magnet for generating a uniform, steady magnetic field within an examination volume,
   at least one RF coil arrangement for generating RF pulses within the examination volume and/or for receiving MR signals from an object positioned in the examination volume,
   a transmission unit, which includes two or more RF power amplifiers supplying RF signals to the RF coil arrangement,
   a control unit controlling the temporal succession of RF pulses, which control unit is adapted to activate the RF power amplifiers alternately in a time-multiplexed fashion, wherein the RF power amplifiers associated with different groups (I, II) of coil elements are activated during non-overlapping or partly overlapping time slots and in the case of a non-overlapping activation of the different RF power amplifiers, an incoherent sum of the RF signals is generated during the different activation periods and in the case of a partly overlapping activation of the individual RF power amplifiers, a coherent superposition of the RF signals is generated, thereby generating a sequence of RF pulses requiring a RF duty cycle and/or a RF pulse duration exceeding the specification of at least one of the RF power amplifiers.

8. The MR device of claim 7, wherein the transmission unit comprises attenuators and/or phase shifters operated by the control unit for controlling the amplitudes and/or phases of the RF signals supplied to the RF coil arrangement.

9. The MR device of claim 7, wherein all RF power amplifiers are high-power/low-duty-cycle amplifiers.

10. The MR device of claim 7, wherein at least one RF power amplifier is a high-power/low-duty-cycle amplifier while at least one other RF power amplifier is a low-power/high-duty-cycle amplifier.

11. The MR device of claim 7, wherein all RF power amplifiers are configured to generate the RF signals at substantially the same frequency throughout the sequence of RF pulses.

12. The MR device of claim 7 wherein the control unit is configured to control the amplitudes and/or the phases of the RF signals supplied to the RF coil arrangement via the individual RF power amplifiers in such a manner that the instantaneous and/or the time-integrated homogeneity of the RF magnetic field distribution of the at least one RF pulse is optimized and/or the heat deposition induced by the at least one RF pulse within the portion of the body is minimized.

13. The method of claim 1, wherein the amplitudes and/or the phases of the RF signals supplied to the RF coil arrangement via the individual RF power amplifiers are controlled in such a manner that the instantaneous and/or the time-integrated homogeneity of the RF magnetic field distribution of the at least one RF pulse is optimized and/or the heat deposition induced by the at least one RF pulse within the portion of the body is minimized.

14. A method of magnetic resonance (MR) spectroscopy of an object, the method comprising the steps of:
subjecting the object to a spectroscopy sequence comprising at least one radiofrequency (RF) pulse, the RF pulse being transmitted toward the object via an RF coil arrangement to which RF signals are supplied by two or more RF power amplifiers, the RF power amplifiers being activated alternately during the spectroscopy sequence in a time-multiplexed fashion, wherein the RF power amplifiers associated with different groups (I, II) of coil elements are activated during non-overlapping or partly overlapping time slots and in the case of a non-overlapping activation of the different RF power amplifiers, an incoherent sum of the RF signals is generated during the different activation periods and in the case of a partly overlapping activation of the individual RF power amplifiers, a coherent superposition of the RF signals is generated, wherein the spectroscopy sequence requires an RF duty cycle and/or an RF pulse duration exceeding a specification of at least one of the RF power amplifiers;
acquiring MR signals from the object; and
deriving an MR spectrum from the acquired MR signals.

15. The method of claim 14, wherein the at least one RF pulse is generated by alternately activating the RF power amplifiers, wherein the at least one RF pulse is subdivided into sets of RF pulse segments, each set of RF pulse segments being generated by a different RF power amplifier or set of RF power amplifiers.

16. The method of claim 15, wherein the frequency of the RF pulse is substantially the same for all RF pulse segments.

17. The method of claim 14, wherein the at least one RF pulse is
a saturation RF pulse for saturating nuclear magnetization, or
a spin locking RF pulse, or
a polarization transfer RF pulse for transferring magnetization between different nuclear spins, or
a proton decoupling RF pulse.

18. The method of claim 17, wherein the at least one RF pulse is a frequency-selective saturation RF pulse for saturating nuclear magnetization of protons of an exchangeable endogenous proton pool or of a CEST contrast agent.

19. The method of claim 14, wherein the RF coil arrangement comprises two or more coil elements, each coil element being assigned to a group of coil elements, wherein each group of coil elements is associated with at least one RF power amplifier supplying RF signals to the coil elements of the respective group of coil elements.

20. A magnetic resonance (MR) device configured to perform the method of claim 14, the MR device comprising:
a main magnet for generating a uniform, steady magnetic field within an examination volume,
at least one RF coil arrangement for generating RF pulses within the examination volume and/or for receiving MR signals from an object positioned in the examination volume,
a transmission unit, which includes two or more RF power amplifiers supplying RF signals to the RF coil arrangement,
a control unit controlling the temporal succession of RF pulses, which control unit is adapted to activate the RF power amplifiers alternately in a time-multiplexed fashion, wherein the RF power amplifiers associated with different groups (I, II) of coil elements are activated during non-overlapping or partly overlapping time slots and in the case of a non-overlapping activation of the different RF power amplifiers, an incoherent sum of the RF signals is generated during the different activation periods and in the case of a partly overlapping activation of the individual RF power amplifiers, a coherent superposition of the RF signals is generated, thereby generating a sequence of RF pulses requiring a RF duty cycle and/or a RF pulse duration exceeding the specification of at least one of the RF power amplifiers.

21. The MR device of claim 20, wherein the transmission unit comprises attenuators and/or phase shifters operated by the control unit for controlling the amplitudes and/or phases of the RF signals supplied to the RF coil arrangement.

22. The MR device of claim 20, wherein all RF power amplifiers are high-power/low-duty-cycle amplifiers.

23. The MR device of claim 20, wherein at least one RF power amplifier is a high-power/low-duty-cycle amplifier while at least one other RF power amplifier is a low-power/high-duty-cycle amplifier.

24. The MR device of claim 20, wherein all RF power amplifiers are configured to generate the RF signals at substantially the same frequency throughout the sequence of RF pulses.

25. A non-transitory computer-readable medium comprising instructions that when executed by a processor cause the processor to perform a method, the method comprising:
generating a magnetic resonance (MR) imaging or spectroscopy sequence which comprises at least one radiofrequency (RF) pulse by activating two or more RF power amplifiers during the imaging or spectroscopy sequence in a time-multiplexed fashion, wherein the RF power amplifiers associated with different groups (I, II) of coil elements are activated during non-overlapping or partly overlapping time slots and in the case of a non-overlapping activation of the different RF power amplifiers, an incoherent sum (i.e. the modulus) of RF signals is generated during the different activation periods and in the case of a partly overlapping activation of the individual RF power amplifiers, a coherent superposition of RF signals is generated, wherein the imaging or spectroscopy sequence requires an RF duty cycle and/or an RF pulse duration exceeding a specification of at least one of the RF power amplifiers;

recording at least one MR signal;

reconstructing an MR image or deriving an MR spectrum from the recorded MR signals.

* * * * *